United States Patent [19]
Asahina

[11] Patent Number: 5,617,045
[45] Date of Patent: Apr. 1, 1997

[54] INPUT CIRCUIT FOR PROCESSING SMALL AMPLITUDE INPUT SIGNALS

[75] Inventor: Katsushi Asahina, Itami, Japan

[73] Assignee: Mitsubishi Denki Kabushiki Kaisha, Tokyo, Japan

[21] Appl. No.: 104,570

[22] Filed: Aug. 11, 1993

[30]   Foreign Application Priority Data

Sep. 18, 1992  [JP]  Japan .................................. 4-249257

[51] Int. Cl.⁶ .................... H03K 19/0185; H03K 19/017
[52] U.S. Cl. ............................ 327/89; 327/97; 327/328; 327/374; 327/333; 326/17; 326/68
[58] Field of Search ........................... 307/530; 365/207; 326/68, 63, 17, 178; 327/89, 77, 56, 53, 52, 333, 328, 97, 374

[56]            References Cited

U.S. PATENT DOCUMENTS

| | | | |
|---|---|---|---|
| 3,947,778 | 3/1976 | Hsiao et al. ............................. | 307/279 |
| 4,456,840 | 6/1984 | Ide et al. .................................. | 327/89 |
| 4,471,244 | 9/1984 | Maples ..................................... | 327/56 |
| 4,665,326 | 5/1987 | Domogalla ............................. | 307/491 |
| 4,874,969 | 10/1989 | Meadows ................................ | 307/494 |
| 4,918,399 | 4/1990 | Deuecchi et al. ....................... | 330/253 |
| 4,984,204 | 1/1991 | Sato et al. ............................... | 327/52 |
| 5,023,488 | 6/1991 | Gunning . | |
| 5,122,690 | 6/1992 | Bianchi ................................... | 307/263 |
| 5,311,083 | 5/1994 | Wanlass .................................. | 326/68 |
| 5,347,175 | 9/1994 | Laug et al. .............................. | 327/77 |

FOREIGN PATENT DOCUMENTS

| | | |
|---|---|---|
| 4010145 | 1/1991 | Germany . |
| 4-20119 | 1/1992 | Japan . |

*Primary Examiner*—Timothy P. Callahan
*Assistant Examiner*—Terry L. Englund
*Attorney, Agent, or Firm*—Oblon, Spivak, McClelland, Maier & Neustadt, P.C.

[57]            ABSTRACT

There is disclosed an input circuit for a semiconductor integrated circuit device wherein a level shift circuit (LS1) adds a constant voltage to an input signal from an input signal terminal (3) and a reference voltage from a reference voltage terminal (4) to output signals, which are in turn amplified by means of a plurality of cascaded, first and second differential amplifier circuits (Dif1, Dif2), and then a difference between the amplified input signal and the amplified reference voltage is applied to a CMOS inverter circuit (In1), which in turn outputs a power supply potential ($V_{DD}$) or a ground potential ($V_{SS}$) in accordance with the difference, thereby achieving a high-speed operation in response to the binary input signal slightly varying in signal voltage and a normal operation independent of variation of the reference voltage. (FIG. 1)

21 Claims, 5 Drawing Sheets

5,617,045

INPUT CIRCUIT FOR PROCESSING SMALL AMPLITUDE INPUT SIGNALS

BACKGROUND OF THE INVENTION

1. Field of the Invention

The present invention relates to an input circuit for a semiconductor integrated circuit device and, more particularly, to an improvement in operating characteristics of an input circuit for processing an input signal having an amplitude smaller than the amplitude of the signal outputted from an inverter circuit of the input circuit.

2. Description of the Background Art

FIG. 7 is a circuit diagram of a conventional input circuit for a semiconductor integrated circuit device. In FIG. 7, reference numeral 100 designates a PMOS transistor; 101 designates an NMOS transistor; 1 designates a power source for supplying a power supply potential $V_{DD}$; 2 designates a power source for supplying a ground potential $V_{SS}$; 3 designates an input terminal of the input circuit; and 5 designates an output terminal of the input circuit.

In operation, the PMOS transistor 100 and the NMOS transistor 101 form a CMOS inverter circuit. When a voltage $V_{IN}$ of a signal applied to the input terminal 3 is not more than a logical threshold voltage $V_T$ of the CMOS inverter circuit, the power supply potential $V_{DD}$ given through the PMOS transistor 100 is outputted to the output terminal 5 of the input circuit. Conversely, when the voltage $V_{IN}$ is not less than the logical threshold voltage $V_T$, the ground potential $V_{SS}$ given through the NMOS transistor 101 is outputted to the output terminal 5 of the input terminal.

The logical threshold voltage $V_T$ of the CMOS inverter circuit is determined by the current driving capability ratio of the NMOS transistor 101 to the PMOS transistor 100 and, accordingly, is strongly affected by fabrication variations of semiconductor integrated circuit devices. When the voltage of the input signal is indicated as $V_{TN} \leq V_{IN} \leq V_{DD}+V_{TP}$ ($V_{TN}$ is a threshold voltage of the NMOS transistor, and $V_{TP}$ is a threshold voltage of the PMOS transistor), neither the PMOS transistor 100 nor the NMOS transistor 101 enters the cut-off state, so that power is dissipated by the path extending from the power source 1 and through the PMOS and NMOS transistors 100 and 101 to the power source 2.

The conventional input circuit having the foregoing arrangement has the problem that the small amplitude of the input signal causes lower operating speeds and more power consumption of the input circuit.

SUMMARY OF THE INVENTION

The present invention is intended for an input circuit for a semiconductor integrated circuit device which receives a binary signal for outputting a first potential or a second potential higher than the first potential in response to the binary signal. According to the present invention, the input circuit comprises: an input terminal receiving the binary input signal; a reference voltage input terminal receiving a reference voltage serving as a reference for distinction of logical states; a voltage changer circuit connected to the input terminal and the reference voltage input terminal for performing voltage change so that the input signal and the reference voltage are shifted a predetermined amount of voltage, respectively, to output signals; at least one cascaded differential amplifier circuit having first and second differential inputs receiving the output signals of the voltage changer circuit, respectively, for amplifying a difference between the input signal and the reference voltage to output the amplified difference; a CMOS inverter circuit having an input connected to the output of the differential amplifier circuit and an output for outputting the first or second potential in response to the output of the differential amplifier circuit; and an output terminal connected to the output of the CMOS inverter circuit.

The voltage changer circuit of the invention shifts the input signal and the reference voltage a predetermined amount of voltage so that the differential amplifier circuit located in the succeeding position operates in response to the input signal and the reference voltage when the binary input signal is at a low level close to the first or second potential. The differential amplifier circuit receives the predetermined voltage added input signal and reference voltage at the first and second differential inputs to amplify the difference therebetween to output the amplified difference. The CMOS inverter circuit compares the amplified difference with the logical threshold voltage thereof to output the first potential when the former is higher than the latter and to output the second potential when the former is lower than the latter. Since the differential amplifier circuit amplifies the difference between the input signal and the reference voltage, the input signal which is close to the first or second potential and has a small amplitude is permitted by the amplification to have an increased amplitude with respect to the logical threshold voltage of the CMOS inverter circuit at the input thereof. A region of the CMOS inverter circuit which enables less power consumption and high-speed operation may be used in addition to a region of the CMOS inverter circuit which enables more power consumption and low-speed operation adjacent the logical threshold voltage.

The input circuit of the present invention is effective to operate at high speeds in response to the input signal having a small amplitude and to reduce the power consumption of the CMOS inverter circuit when the signal amplitude is small.

Preferably, the input circuit is adjusted such that the CMOS inverter circuit outputs the first or second potential when the input signal is higher than the reference voltage and the CMOS inverter circuit outputs the second or first potential when the input signal is lower than the reference voltage, and the differential amplifier circuit includes a differential amplifier circuit characterized so that its common-mode gain divided by its differential-mode gain is less than the ratio of the amplitude of the input signal to variation of the reference voltage.

When the reference voltage to be inputted varies from the initial reference voltage controlled such that the CMOS inverter circuit outputs the first or second potential when the input signal is higher than the reference voltage in the input circuit and the CMOS inverter circuit outputs the second or first potential when the input signal is lower than the reference voltage, the differential amplifier circuit which is characterized so that its common-mode gain divided by its differential-mod gain is less than the ratio of the amplitude of the input signal to variation of the reference voltage permits the variation (off-set voltage) in the determining level for the input signal due to variation of the reference voltage to be smaller than the amplitude of the input signal.

The input circuit of the peccant invention is effective to operate normally independently of variation of the reference voltage for judging the logical states of the input signal in addition to the foregoing effects of high-speed operation in response to the input signal having the small amplitude and less power consumption of the CMOS inverter circuit with the small amplitude.

In another aspect of the present invention, the input circuit comprises: an input terminal receiving the binary input signal; a reference voltage input terminal receiving a reference voltage serving as a reference for distinction of logical states; a first differential amplifier circuit having first and second differential inputs connected to the input terminal and the reference voltage input terminal, respectively, for amplifying a difference between the input signal and the reference voltage to output the amplified difference; at least one second, cascaded differential amplifier circuit connected to the first differential amplifier circuit for further amplifying the amplified difference to output the further amplified difference; a CMOS inverter circuit having an input connected to the output of the second differential amplifier circuit and an output for outputting the first or second potential in response to the output of the second differential amplifier circuit; and an output terminal connected to the output of the CMOS inverter circuit.

The first differential amplifier circuit, which receives the input signal at, for example, a differential amplifier circuit of NMOS current mirror load when the input signal is close to the first potential and receives the input signal at, for example, a differential amplifier circuit of PMOS current mirror load when the input signal is close to the second potential, is permitted to operate in either case. The first and second differential amplifier circuits receive the input signal and the reference voltage at the first and second differential inputs thereof to amplify the difference between the input signal and the reference voltage to output the amplified difference. The CMOS inverter circuit compares the amplified difference with the logical threshold voltage thereof to output the first potential when the former is higher than the latter and outputs the second potential when the former is lower than the latter. Since the first and second differential amplifier circuits amplify the difference between the input signal and the reference voltage, the input signal which is close to the first or second potential and has a small amplitude is permitted by the amplification to have an increased amplitude with respect to the logical threshold voltage of the CMOS inverter circuit at the input thereof. A region of the CMOS inverter circuit which enables less power consumption and high-speed operation may be used in addition to a region of the CMOS inverter circuit which enables more power consumption and low-speed operation adjacent the logical threshold voltage.

The input circuit of the present invention is effective to operate at high speeds in response to the input signal having a small amplitude and to reduce the power consumption of the CMOS inverter circuit when the signal amplitude is small.

Preferably, the input circuit is adjusted such that the CMOS inverter circuit outputs the first or second potential when the input signal is higher than the reference voltage and the CMOS inverter circuit outputs the second or first potential when the input signal is lower than the reference voltage, and each of the first and second differential amplifier circuits includes a differential amplifier circuit characterized so that the product of their common-mode gains divided by the product of their differential-mode gains is less than the ratio of the amplitude of the input signal to variation of the reference voltage.

When the reference voltage to be inputted varies from the initial reference voltage controlled such that the CMOS inverter circuit outputs the first or second potential when the input signal is higher than the reference voltage in the input circuit and the CMOS inverter circuit outputs the second or first potential when the input signal is lower than the reference voltage, the first and second differential amplifier circuits which are characterized so that the product of their common-mod gains divided by the product of their differential-mode gains is less than the ratio of the amplitude of the input signal to variation of the reference voltage permits the variation (off-set voltage) in the determining level for the input signal due to variation of the reference voltage to be smaller than the amplitude of the input signal.

The input circuit of the present invention is effective to operate normally independently of variation of the reference voltage for judging the logical states of the input signal in addition to the foregoing effects of high-speed operation in response to the input signal having the small amplitude and less power consumption of the CMOS inverter circuit with the small amplitude.

Preferably, the second differential amplifier circuit includes a plurality of cascaded CMOS differential amplifier circuits having a PMOS current mirror load.

In the second differential amplifier circuit of the invention, the output of the first differential amplifier circuit is further amplified by the plurality of connected CMOS differential amplifier circuits of PMOS current mirror load. The input signal which is close to the first or second potential and has a small amplitude is permitted by the amplification to have an increased amplitude with respect to the logical threshold voltage of the CMOS inverter circuit at the input thereof. A region of the CMOS inverter circuit which enables less power consumption and high-speed operation may be used in addition to a region of the CMOS inverter circuit which enables more power consumption and low-speed operation adjacent the logical threshold voltage. These functions are further enhanced.

The input circuit of the present invention is effective to operate at high speeds in response to the input signal having a small amplitude and to reduce the power consumption of the CMOS inverter circuit when the signal amplitude is small.

A primary object of the present invention is to provide a circuit which operates at high speeds when an input signal having a small amplitude is inputted to an input circuit.

Another object of the invention is to reduce the influence of variations of a reference voltage for distinction of the logical states of an input signal, if supplied from the exterior, on the distinction of the logical states of the input signal.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
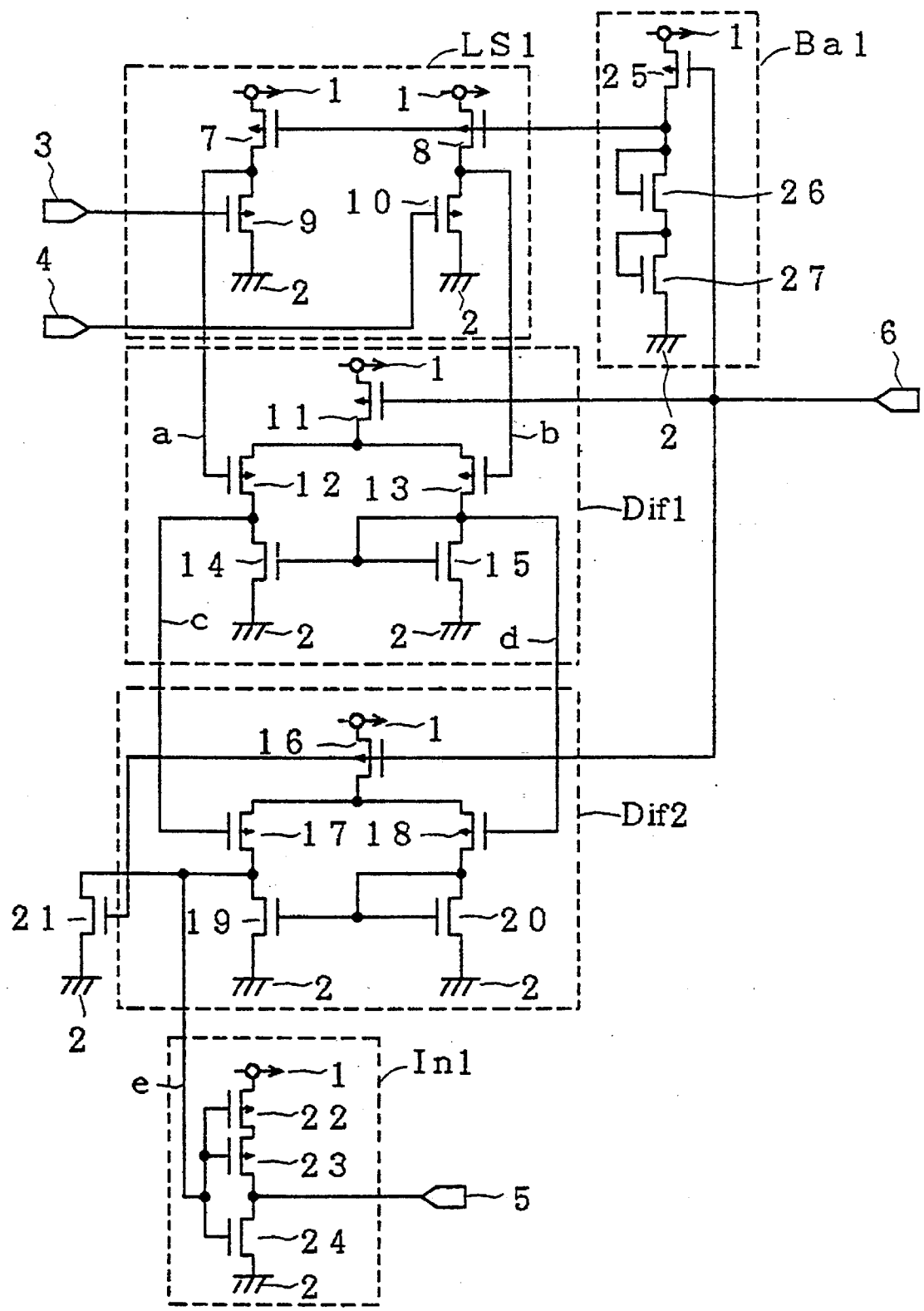
FIG. 1 is a circuit diagram of an input circuit for a semiconductor integrated circuit device according to a first preferred embodiment of the present invention.

Hereinafter described is a first preferred embodiment of the present invention with reference to the drawings. FIG. 1 is a circuit diagram of an input circuit according to the first preferred embodiment of the present invention. In FIG. 1, reference numerals 14, 15, 19, 20, 21, 24, 26, 27 designate NMOS transistors; 7, 8, 9, 10, 11, 12, 13, 16, 17, 18, 22, 23, 25 designate PMOS transistors; 1 designates a power source for supplying a power supply potential $V_{DD}$; 2 designates a power source for supplying a ground potential $V_{SS}$; 3 designates an input signal terminal of an input signal of the input circuit; 4 designates a reference voltage input terminal of the input circuit receiving a reference voltage from the exterior; 5 designates an output terminal of the input circuit; and 6 designates a control signal input terminal receiving a control signal of the input circuit.

The in-series connected PMOS transistors 7, 9 and 8, 10 between the power sources 1 and 2 form a common-source level shift circuit LS1. The input signal terminal 3 is connected to the gate electrode of the PMOS transistor 9, and the reference voltage input terminal 4 is connected to the gate electrode of the PMOS transistor 10. The PMOS transistors 11, 12, 13 and the NMOS transistors 14, 15 form a first differential amplifier circuit Dif1 of NMOS current mirror load. A signalling line a connects the gate electrode of the PMOS transistor 12 serving as a first differential input of the differential amplifier circuit Dif1 to the drain electrode of the PMOS transistor 9 serving as a first output of the level shift circuit LS1. Likewise, a signalling line b connects the gate electrode of the PMOS transistor 13 serving as a second differential input of the differential amplifier circuit Dif1 to the drain electrode of the PMOS transistor 10 serving as a second output of the level shift circuit LS1.

The PMOS transistors 16, 17, 18 and the NMOS transistors 19, 20 form a second differential amplifier circuit Dif2 of NMOS current mirror load. A signalling line c connects the gate electrode of the PMOS transistor 17 serving as a first differential input of the differential amplifier circuit Dif2 to the drain electrode of the NMOS transistor 14 serving as a first output of the first differential amplifier circuit Dif1. Likewise, a signalling line d connects the gate electrode of the PMOS transistor 18 serving as a second differential input of the second differential amplifier circuit Dif2 to the drain electrode of the NMOS transistor 15 serving as a second output of the first differential amplifier circuit Dif1. The PMOS transistors 22, 23 and the NMOS transistor 24 form a CMOS inverter circuit In1. A signalling line e connects the drain electrode of the NMOS transistor 19 serving as an output of the second differential amplifier circuit Dif2 to the gate electrodes of the PMOS transistors 22, 23 and NMOS transistor 24 serving as an input of the CMOS inverter circuit In1. The drain electrodes of the PMOS transistor 23 and NMOS transistor 24 serving as an output of the CMOS inverter circuit In1 are connected to the output terminal 5. The NMOS transistors 26, 27 and the PMOS transistor 25 form a bias voltage generating circuit Ba1 for generating a bias voltage to be applied to the gate electrodes of the PMOS transistors 7, 8.

In operation, when the control signal input terminal 6 of the input circuit is at the ground potential $V_{SS}$, the PMOS transistors 11, 16, 25 having gate electrodes connected to the control signal input terminal 6 are constantly on. At that time, the NMOS transistor 21 having a gate electrode connected to the control signal input terminal 6 is constantly off. In this state, the level shift circuit LS1, the bias voltage generating circuit Ba1 and the first and second differential amplifier circuits Dif1, Dif2 are active.

An input signal $V_{IN}$ is applied to the input signal terminal 3 of the input circuit, and a reference voltage $V_{REF}$ is applied to the reference voltage input terminal 4. The input signal $V_{IN}$ and the reference voltage $V_{REF}$ are shifted to higher potentials by the common-source level shift circuit LS1 including the PMOS transistors 7, 9 and 8, 10, and then resultant signals are outputted through the signalling lines a and b. When the potentials at the signalling lines a and b of FIG. 1 are designated by Va and Vb, respectively, the output voltages of the common-source level shift circuit LS1 are given as:

$$Va = V_{IN} + VS \tag{1}$$

$$Vb = V_{REF} + VS \tag{2}$$

where Vs is positive.

The outputs of the common-source level shift circuit LS1 which are designated by Va and Vb are applied to the gate electrodes of the PMOS transistors 12 and 13 of the first differential amplifier circuit Dif1 through the signalling lines a and b, respectively. The first differential amplifier circuit Dif1 amplifies the voltages Va and Vb to output voltages Vc and Vd from the drain electrodes of the NMOS transistors 14 and 15 through the signalling lines c and d. The output voltages Vc and Vd are given as:

$$Vc = (Va - Vb) \times Ad1 + Vb \times Ac1 \tag{3}$$

$$Vd = Vb \times Ac1 \tag{4}$$

where Ad1 is a differential-mode gain of the first differential amplifier circuit Dif1, and Ac1 is an common-mode gain of the first differential amplifier circuit Dif1.

The output voltages Vc and Vd of the first differential amplifier circuit Dif1 are applied to the gate electrodes of the PMOS transistors 17 and 18 of the second differential amplifier circuit Dif2 through the signalling lines c and d, respectively. An output voltage Ve of the second differential amplifier circuit Dif2 outputted from the drain electrodes of the NMOS transistors 19 and 20 of the second differential amplifier circuit Dif2 through the signalling line e of FIG. 1 is given as:

$$Ve = (Vc - Vd) \times Ad2 + Vd \times Ac2 \tag{5}$$

where Ad2 is a differential-mode gain of the second differential amplifier circuit Dif2, and Ac2 is an common-mode gain of the second differential amplifier circuit Dif2.

Using Expressions (b 1) and (2), the output voltage Ve of the second differential amplifier circuit Dif2 is transformed into:

$$Ve = (V_{IN} - V_{REF}) \times Ad1 \times Ad2 + (V_{REF} + Vs) \times Ac1 \times Ac2 \tag{6}$$

The output voltage Vc of the second differential amplifier circuit Dif2 is applied to the gate electrodes of the PMOS transistors 22, 23 and NMOS transistor 24 serving as the input of the CMOS inverter circuit In1. The output of the CMOS inverter circuit In1 is outputted from the drain electrodes of the PMOS transistor 23 and NMOS transistor 24 through the output terminal 5 of the input circuit. When the voltage Vc applied to the CMOS inverter circuit In1 is lower than a logical threshold voltage $V_T$ of the CMOS inverter circuit In1, the power supply potential $V_{DD}$ is outputted from the output terminal 5 through the PMOS transistors 22 and 23. When the voltage Ve is higher than the logical threshold voltage $V_T$ of the CMOS inverter circuit In1, the ground potential $V_{SS}$ is outputted from the output terminal 5 through the NMOS transistor 24. Such operations are expressed as:

$$V_O = V_{DD}(Ve \leq V_T), \quad V_O = V_{SS}(V_T \leq Ve) \tag{7}$$

where $V_O$ is the output of the CMOS inverter circuit In1. An input signal $V_{IN1}$ or $V_{IN2}$ is applied to the input signal terminal 3 of the input signal circuit where $V_{IN1} = V_{REF} + V_X$ and $V_{IN2} = V_{REF} - V_X$.

When the input signal $V_{IN1}$ is inputted, an output voltage Ve1 of the second differential amplifier circuit Dif2 is as follows:

$$Ve1 = (V_{REF} + V_S) \times Ac1 \times Ac2 + V_X \times Ad1 \times Ad2 \tag{8}$$

When the input signal $V_{IN2}$ is inputted, an output voltage Ve2 of the second differential amplifier circuit Dif2 is as follows:

$$Ve2 = (V_{REF} + V_S) \times Ac1 \times Ac2 - V_X \times Ad1 \times Ad2 \tag{9}$$

The voltage Ve1 or Ve2 expressed by Expression (8) or (9) is applied to the gate electrodes of the PMOS transistors 22, 23 and NMOS transistor 24 of the CMOS inverter circuit In1 through the signalling line e. To correctly operate the input circuit as a binary signal input circuit, the following requirement must be satisfied:

$$(Ve1 - V_T) \times (Ve2 - V_T) \leq 0 \tag{10}$$

Substituting Expressions (8) and (9) in Expression (10), it is found that the following requirement is needed:

$$[\{(V_{REF} + VS) \times Ac1 \times Ac2\} - V_T]^2 - (V_X \times Ad1 \times Ad2)^2 \leq 0 \tag{11}$$

Since the second term on the left $(V_X \times Ad1 \times Ad2)^2$ of Expression (11) is not less than zero, the optimum operation requirement of the circuit is that the first term on the left of Expression (11) is minimized. The first term on the left of Expression (11) is minimized in the following case:

$$V_T = (V_{REF} + V_S) \times Ac1 \times Ac2 \tag{12}$$

The value Vs is a constant since it is the difference between the input voltage and the output voltage of a source follower circuit including the PMOS transistors 7, 9 and 8, 10 which receive the input signal $V_{IN}$ and the reference voltage $V_{REF}$. To satisfy Expression (10) in a wide range of the reference voltage $V_{REF}$, if varied, the product of the common-mode gains $Ac1 \times Ac2$ of the first and second differential amplifier circuits Dif1 and Dif2 must be low. To satisfy Expression (10) when the input amplitude $V_X$ is small, the product of the differential-mod gains $Ad1 \times Ad2$ of the first and second differential amplifier circuits Dif1 and Dif2 must be high. These requirements will be discussed below using an example. A reference voltage $V_{REF0}$ is assumed to be set such that the ground potential $V_{SS}$ is outputted from the output terminal 5 when the input signal $V_{IN}$ is more than the reference voltage $V_{REF0}$ and the power supply potential $VD_{DD}$ is outputted from the output terminal 5 when the input signal $V_{IN}$ is less than the reference voltage $V_{REF0}$. At that time the reference voltage $V_{REF0}$ and the logical threshold voltage $V_T$ of the CMOS inverter circuit In1 are in predetermined relation which is given by:

$$V_T = (V_{REF0} + V_S) \times Ac1 \times Ac2 \tag{13}$$

It is supposed that the reference voltage slightly varies due to some factor. The amount of variation is designated by $\delta V_{REF}$, and then the practical reference voltage $V_{REF}$ applied to the reference voltage input terminal 4 is:

$$V_{REF} = V_{REF0} + \delta V_{REF} \tag{14}$$

Substitution of the logical threshold voltage $V_T$ and the reference voltage $V_{REF}$ given by Expressions (13) and (14) into Expression (11) and rearrangement of the expression gives:

$$\frac{Ac1 \times Ac2}{Ad1 \times Ad2} \leq \frac{V_X}{\delta V_{REF}} \tag{15}$$

It will be found from Expression (15) that the input circuit operates normally independently of slight variation of the reference voltage $V_{REF}$ as far as it falls within the range of $\delta R_{REF}$ which satisfies the relationship of Expression (15).

Further, both $Ac1 \leq 1$ and $Ac2 \leq 1$ are satisfied and both $1 \leq Ad1$ and $1 \leq Ad2$ are satisfied in the input circuit of FIG. 1 since $\beta_N \leq \beta_P$ ($\beta_N$ is a mutual conductance of the NMOS transistors 14, 15, 19 and 20, and $\beta_P$ is a mutual conductance of the PMOS transistors 12, 13, 17 and 18). Therefore the requirement indicated by Expression (12) is necessarily satisfied. This provides for the input circuit having a small offset voltage that is estimated as the input voltage independently of variation in reference voltage $V_{REF}$ applied to the reference voltage input terminal 4.

Figure 2:
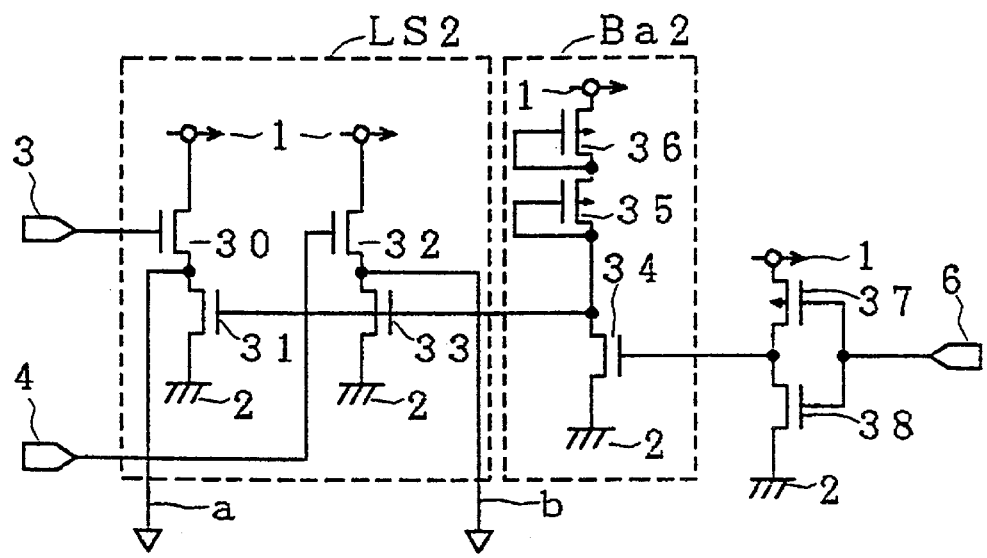
FIG. 2 is a circuit diagram of a voltage changer circuit of another mode for use in the input circuit of the first preferred embodiment.

In the first preferred embodiment, as the input signal $V_{IN}$ and the reference voltage $V_{REF}$ are close to the ground potential $V_{SS}$, the level shift circuit LS1 including the PMOS source follower circuit acting as a voltage changer circuit carries out the voltage change on the input signal $V_{IN}$ and the reference voltage $V_{REF}$. As the input signal $V_{IN}$ and the reference voltage $V_{REF}$ are close to the power supply potential $V_{DD}$, a level shift circuit LS2 including an NMOS source follower circuit acting as the voltage changer circuit is suitable to carry out the voltage change on the input signal $V_{IN}$ and the reference voltage $V_{REF}$, as shown in FIG. 2. Referring to FIG. 2, the input signal $V_{IN}$ is inputted to the gate electrode of an NMOS transistor 30 having a drain electrode connected to the power source 1 and is then outputted from the source electrode of the NMOS transistor 30 through the signalling line a. The reference voltage $V_{REF}$ is inputted to the gate electrode of an NMOS transistor 32 having a drain electrode connected to the power source 1 and is then outputted from the source electrode of the NMOS transistor 32 through the signalling line b. A bias voltage generating circuit Ba2 generates a bias voltage to be applied to the gate electrodes of NMOS transistors 31 and 33. An inverter circuit consisting of a PMOS transistor 37 and an NMOS transistor 38 inverts a control signal for controlling the bias voltage generating circuit Ba2 given from the control signal input terminal 6 to apply the inverted control signal to the gate electrode of a PMOS transistor 34.

Figure 3:
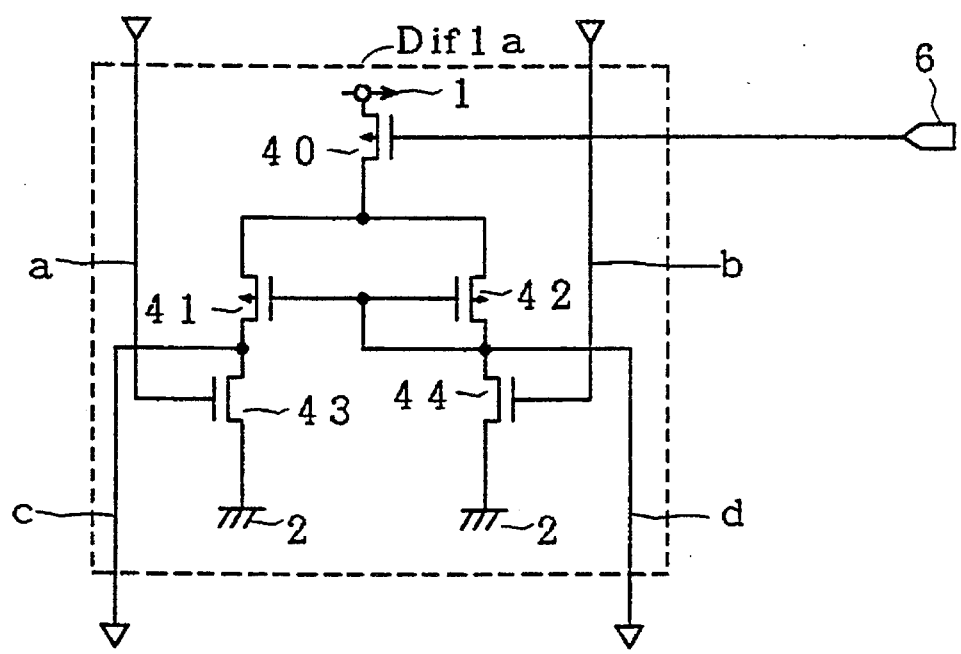
FIG. 3 is a circuit diagram of a differential amplifier circuit of another mode for use in the input circuit of the first preferred embodiment.

Although the two, first and second, differential amplifier circuits Dif1 and Dif2 of NMOS current mirror load are used in the first preferred embodiment, a differential amplifier circuit of PMOS current mirror load may be used. For example, a differential amplifier circuit Dif1a as shown in FIG. 3 may be substituted for the first differential amplifier circuit Dif1 of FIG. 1. The differential amplifier circuit Dif1a includes a current mirror load consisting of PMOS transistors 41 and 42, and receives the output signals of the level shift circuit LS1 of FIG. 1 inputted from the signalling lines a and b at the gate electrodes of NMOS transistors 43 and 44 to output signals at the signalling lines c and d connected to the drain electrodes of the PMOS transistors 41 and 42. The same is true for the second differential amplifier circuit Dif2.

Although the two connected differential amplifier circuits in the first preferred embodiment are shown in FIG. 1, one differential amplifier circuit or more than two connected differential amplifier circuits may be used. Connection of more differential amplifier circuits is advantageous for decreasing the product of the common-mode gains Ac1×Ac2 of the first and second differential amplifier circuits Dif1 and Dif2 of FIG. 1 and for increasing the product of the differential-mode gains Ad1×Ad2 of the first and second differential amplifier circuits Dif1 and Dif2. The number for differential amplifier circuits to be connected, however, may be determined in accordance with specifications of the power consumption and other characteristics of the input circuit.

In FIG. 1, upon application of the power supply potential $V_{DD}$ to the control signal input terminal 6, the PMOS transistors 7 and 8 turn off so that the level shift circuit LS1 becomes inactive, the PMOS transistor 25 turns off so that the bias voltage generating circuit Ba1 becomes inactive, and the PMOS transistors 11 and 16 turn off so that the first and second differential amplifier circuits Dif1 and Dif2 become inactive. In this state, an inspection is made for shorts and the like between the power sources 1 and 2. However, the input of the CMOS inverter circuit In1 is unstable, and accordingly the input circuit enters an unstable state. To prevent such unstable state, the NMOS transistor 21 is provided to fix the input signal of the CMOS inverter circuit In1 to the ground potential $V_{SS}$.

Figure 4:
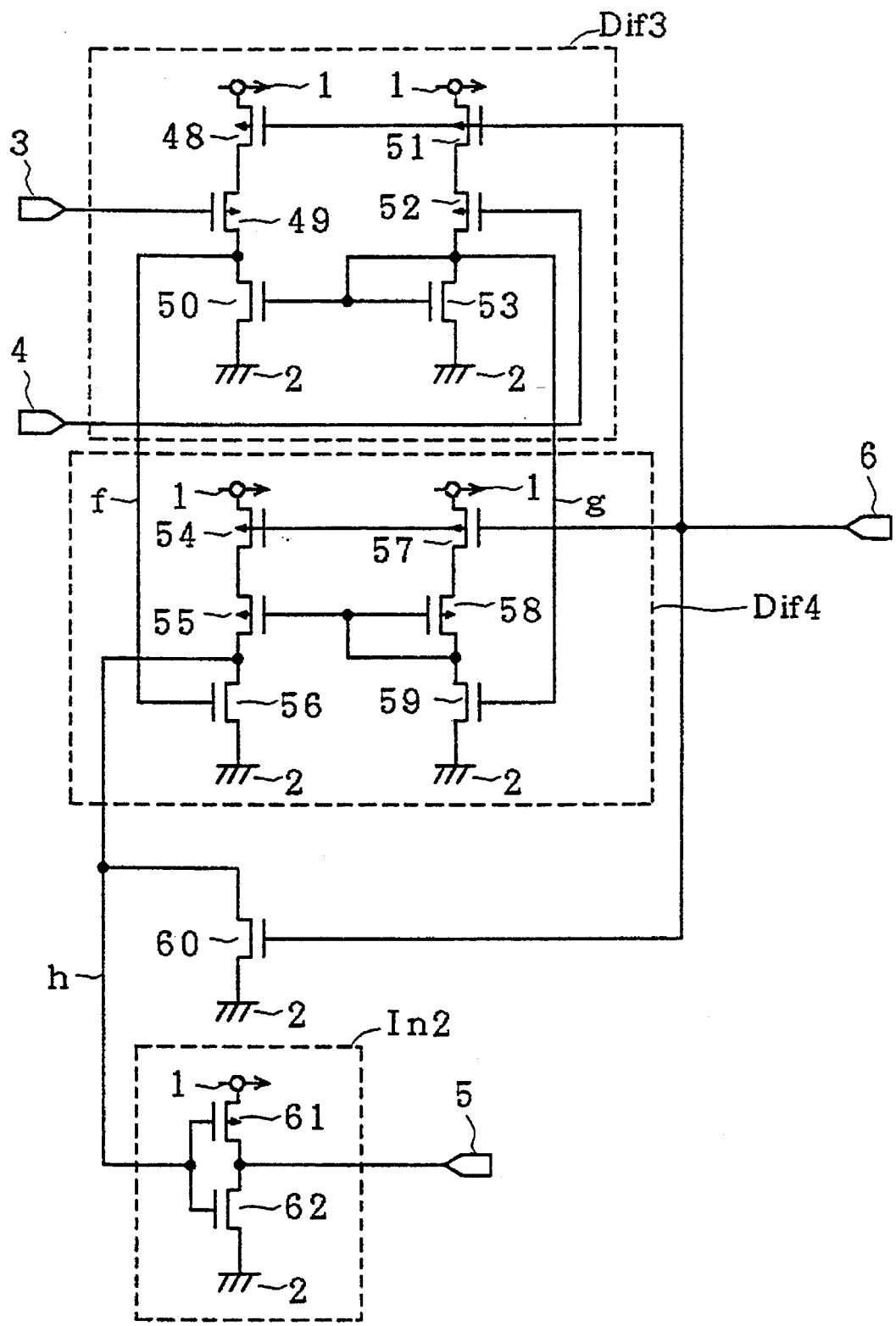
FIG. 4 is a circuit diagram of an input circuit for the semiconductor integrated circuit device according to a second preferred embodiment of the present invention.

Description will now be given on a second preferred embodiment according to the present invention. FIG. 4 is a circuit diagram of the input circuit of the second preferred embodiment according to the present invention. In FIG. 4, reference numerals 48, 49, 51, 52, 54, 55, 57, 58, 61 designate PMOS transistors, and 50, 53, 56, 59, 60, 62 designate NMOS transistors. Other elements of FIG. 4 identical with or corresponding to those of FIG. 1 are designated by the same reference characters.

The PMOS transistors 48, 49 and NMOS transistor 50 connected in series between the power sources 1 and 2 and the PMOS transistors 51, 52 and NMOS transistor 53 connected in series between the power sources 1 and 2 form a first differential amplifier circuit Dif3 that is a CMOS differential amplifier circuit of NMOS current mirror load. The input signal terminal 3 is connected to the gate electrode of the PMOS transistor 49, and the reference voltage input terminal 4 is connected to the gate electrode of the PMOS transistor 52. A first output signal is outputted from the drain electrode of the NMOS transistor 50 of the first differential amplifier circuit Dif3 through a signalling line f, whereas a second output signal is outputted from the drain electrode of the NMOS transistor 53 of the first differential amplifier circuit Dif3 through a signalling line g.

The PMOS transistors 54, 55, 57, 58 and NMOS transistors 56, 59 form a second differential amplifier circuit Dif4 of PMOS current mirror load. The signalling line f connects the drain electrode of the NMOS transistor 50 serving as a first output of the first differential amplifier circuit Dif3 to the gate electrode of the NMOS transistor 56 serving as a first differential input of the second differential amplifier circuit Dif4. Likewise, the signalling line g connects the drain electrode of the NMOS transistor 53 serving as a second output of the first differential amplifier circuit Dif3 to the gate electrode of the NMOS transistor 59 serving as a second differential input of the second differential amplifier circuit Dif4. The PMOS transistor 61 and the NMOS transistor 62 form a CMOS inverter circuit In2. A signalling line h connects the drain electrode of the NMOS transistor 55 serving as an output of the second differential amplifier circuit Dif4 to the gate electrodes of the PMOS transistor 61 and NMOS transistor 62 serving as an input of the CMOS inverter circuit In2. The drain electrodes of the PMOS transistor 61 and NMOS transistor 62 serving as an output of the CMOS inverter circuit In2 are connected to the output terminal 5.

In operation, when the ground potential $V_{SS}$ is applied to the control signal input terminal 6 of the input circuit, the PMOS transistors 48, 51, 54, 57 having gate electrodes connected to the control signal input terminal 6 are constantly on. The NMOS transistor 60 having a gate electrode connected to the control signal input terminal 6 is constantly off. Thus the first and second differential amplifier circuits Dif3 and Dif4 are active.

In the foregoing state, it is assumed that an input signal $V_{IN}$ of small amplitude which is at a level close to the ground potential $V_{SS}$ is applied to the input signal terminal 3 of the input circuit and a reference voltage $V_{REF}$ close to the ground potential $V_{SS}$ is applied to the reference voltage input terminal 4 of the input circuit. The input signal $V_{IN}$ and the reference voltage $V_{REF}$ are amplified by the first differential amplifier circuit Dif3 and then output voltages Vf and Vg are outputted through the signalling lines f and g of FIG. 4. The output voltages Vf and Vg of the first differential amplifier circuit Dif3 are further amplified by the second differential amplifier circuit Dif4 and then an output voltage Vh is outputted through the signalling line h. The output voltage Vh of the second differential amplifier circuit Dif4 is applied to the gate electrodes of the PMOS transistor 61 and NMOS transistor 62 of the CMOS inverter circuit In2 through the signalling line h. Relationship between the input signal voltage $V_{IN}$, the reference voltage signal $V_{REF}$ and the output voltage Vh of the second differential amplifier circuit Dif4 is given in the same manner as that of FIG. 1 by:

$$Vh = (V_{IN} - V_{REF}) \times Ad1 \times Ad2 + V_{REF} \times Ac1 \times Ac2 \qquad (16)$$

where Ad1 is a differential-mode gain of the first differential amplifier circuit Dif3, Ac1 is an common-mode gain of the first differential amplifier circuit Dif3, Ad2 is a differential-mode gain of the second differential amplifier circuit Dif4, and Ac2 is an common-mode gain of the second differential amplifier circuit Dif4.

Since the output voltage Vh of the second differential amplifier circuit Dif4 is applied to the CMOS inverter circuit In2 consisting of the PMOS transistor 61 and the NMOS transistor 62, the same discussion as the first preferred embodiment is made where the logical threshold voltage of the CMOS inverter circuit In2 is designated by $V_T$. Selection of the constants of the respective MOS transistors so as to satisfy both Ac1≦1 and Ac2≦1 and to satisfy both 1≦Ad1 and 1≦Ad2 provides for the input circuit having a small offset voltage that is estimated as the input voltage independently of variation in reference voltage $V_{REF}$ applied to the reference voltage input terminal 4.

Figure 5:
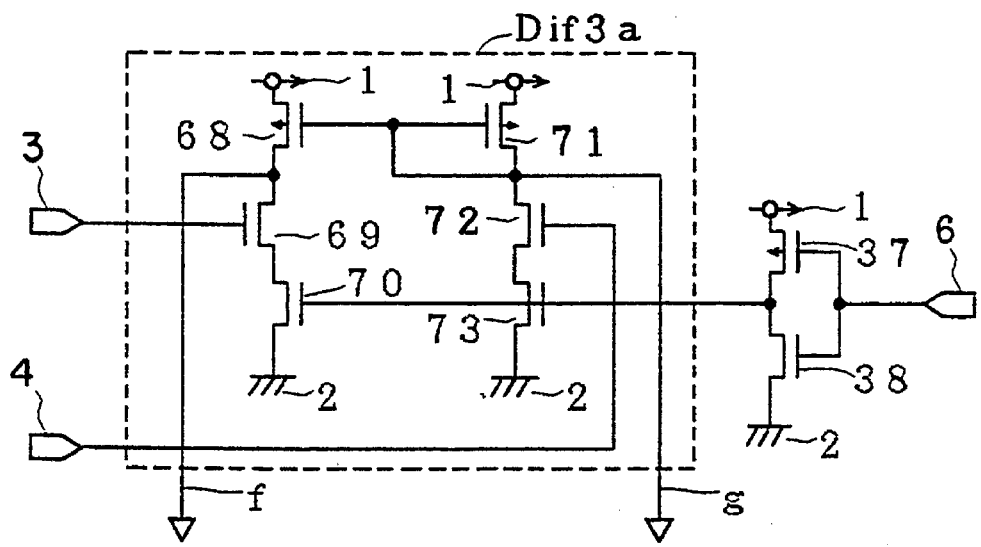
FIG. 5 is a circuit diagram of a first differential amplifier circuit of another mode for use in the input circuit of the second preferred embodiment.

In the second preferred embodiment, as the input signal $V_{IN}$ and the reference voltage $V_{REF}$ are close to the ground potential $V_{SS}$, the first differential amplifier circuit Dif3 performs amplification on the input signal $V_{IN}$ and the reference voltage $V_{REF}$. However, as the input signal $V_{IN}$ and the reference voltage $V_{REF}$ are close to the power supply potential $V_{DD}$, a differential amplifier circuit of PMOS current mirror load is suitable to carry out the amplification on the input signal $V_{IN}$ and the reference voltage $V_{REF}$, as shown in FIG. 5. For example, referring to FIG. 5, a differential amplifier circuit Dif3a is used as the first differential amplifier circuit. The input signal $V_{IN}$ is inputted to the gate electrode of an NMOS transistor 69, and then the resultant signal is outputted from the drain electrode of a PMOS transistor 68 through the signalling line f. The reference voltage $V_{REF}$ is inputted to the gate electrode of an NMOS transistor 72, and then the resultant signal is outputted from the drain electrode of a PMOS transistor 71 through the signalling line g.

Figure 6:
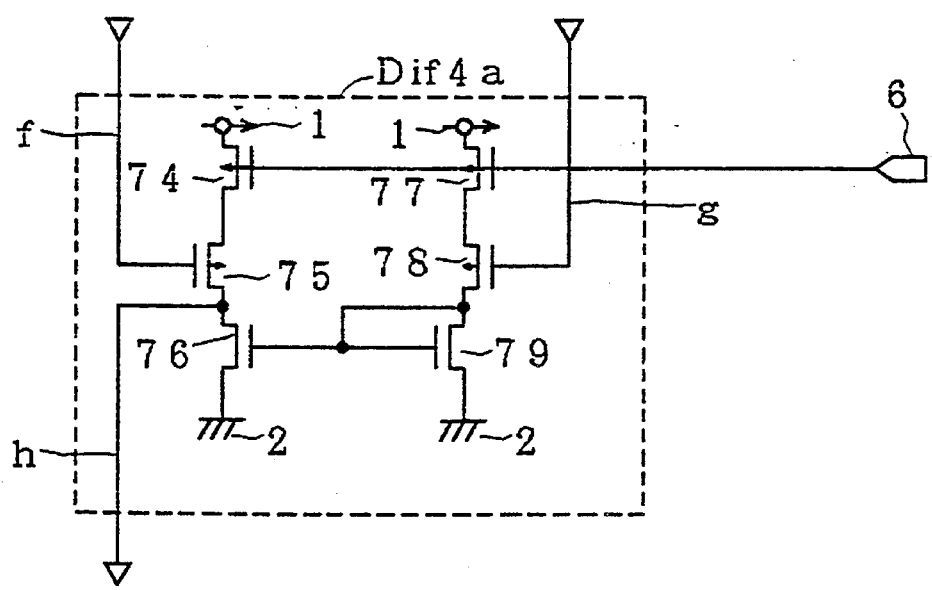
FIG. 6 is a circuit diagram of a second differential amplifier circuit of another mode for use in the input circuit of the second preferred embodiment.
Figure 7:
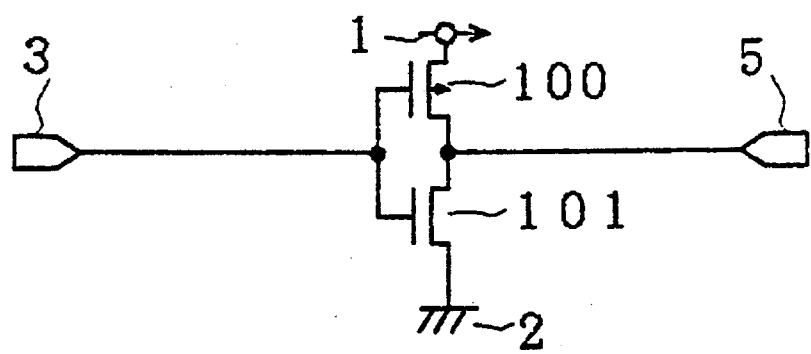
FIG. 7 is a diagram of a conventional input circuit for the semiconductor integrated circuit device.

Although the differential amplifier circuit Dif4 of PMOS current mirror load is used as the second differential amplifier circuit in the second preferred embodiment, a differential amplifier circuit of NMOS current mirror load may be used as the second differential amplifier circuit. For example, a differential amplifier circuit Dif4a as shown in FIG. 6 may be substituted for the second differential amplifier circuit Dif4 of FIG. 4. The second differential amplifier circuit Dif4a includes a current mirror load consisting of NMOS transistors 76, 79. The gate electrodes of PMOS transistors 75 and 78 receive the output signals of the second differential amplifier circuit Dif4 of FIG. 4 given from the signalling lines f and g, and the resultant signal is outputted from the signalling line h connected to the drain electrode of an NMOS transistor 76. However, taking into consideration the operating speed of the input circuit, the second differential amplifier circuit Dif4 of FIG. 4 is more advantageous which receives the input signal at the NMOS transistor.

One succeeding differential amplifier circuit is shown as connected to the first differential amplifier circuit Dif3 in the second preferred embodiment in FIG. 4. More differential amplifier circuits may be cascaded, which is advantageous for decreasing the product of the common-mode gains Ac1×Ac2 of the first and second differential amplifier circuits Dif3 and Dif4 of FIG. 1 and for increasing the product of the differential-mode gains Ad1×Ad2 of the first and second differential amplifier circuits Dif3 and Dif4. The number of differential amplifier circuits to be cascaded should be determined in accordance with specifications of power consumption and other characteristics of the input circuit.

In FIG. 4, upon amplification of the power supply potential $V_{DD}$ to the control signal input terminal 6, the PMOS transistors 48, 51 and 54, 57 turn off so that the first and second differential amplifier circuits Dif3 and Dif4 become inactive. In this state, an inspection is made for shorts between the power sources 1 and 2. However, the input of the CMOS inverter circuit In2 is unstable, and accordingly the input circuit enters an unstable state. To prevent such unstable state, the NMOS transistor 60 is provided to fix the input signal of the CMOS inverter circuit In2 to the ground potential $V_{SS}$.

While the invention has been shown and described in detail, the foregoing description is in all aspects illustrative and not restrictive. It is therefore understood that numerous modifications and variations can be devised without departing from the scope of the invention.

What is claimed is:

1. An input circuit for a semiconductor integrated circuit device which receives a binary signal for outputting a first potential or a second potential higher than said first potential in response to said binary signal, said input circuit comprising:

an input terminal receiving said binary input signal;

a reference voltage input terminal receiving a reference voltage serving as a reference for distinction of logical states;

a level shift circuit connected to said input terminal and said reference voltage input terminal, for changing a center of amplitude of said input signal to a predetermined level without changing an amplitude of said input signal and for changing said reference voltage to said predetermined level, and to output signals;

at least one cascaded differential amplifier circuit having first and second differential inputs receiving the output signals of said level shift circuit, respectively, for amplifying a difference between said input signal and said reference voltage to output the amplified difference;

a CMOS inverter circuit having an input connected to the output of said differential amplifier circuit and an output for outputting said first or second potential in response to the output of said differential amplifier circuit; and an output terminal connected to said output of said CMOS inverter circuit;

wherein the amplitude of said input signal is such that differential amplification impossible without first changing the center of amplitude to said predetermined level; wherein, said differential amplifier circuit includes a plurality of cascaded differential amplifier circuits;

said plurality of differential amplifier circuits include a CMOS differential amplifier circuit having an NMOS current mirror load;

said CMOS differential amplifier circuit having said NMOS current mirror load includes, (a) a first differential amplifier circuit including, a first PMOS transistor having a source electrode connected to a second source having said second potential, a gate electrode connected to said first differential input, and a drain electrode;

a second PMOS transistor having a source electrode connected to said second source, a gate electrode connected to said second differential input, and a drain electrode;

a first NMOS transistor having a drain electrode connected to said drain electrode of said first PMOS transistor, a source electrode connected to a first source having said first potential, and a gate electrode; and a second NMOS transistor having a gate electrode connected to said gate electrode of said first NMOS transistor and to said drain electrode of said second PMOS transistor, a drain electrode connected to said drain electrode of said second PMOS transistor, and a source electrode connected to said first source, and (b) a second differential amplifier circuit including, a third PMOS transistor having a source electrode connected to said second source, a gate electrode connected to said drain electrode of said first NMOS transistor, and a drain electrode;

a fourth PMOS transistor having a source electrode connected to said second source, a gate electrode connected to said drain electrode of said second NMOS transistor, and a drain electrode;

a third NMOS transistor having a drain electrode connected to said drain electrode of said third PMOS transistor, a source electrode connected to said first source, and a gate electrode; and a fourth NMOS transistor having a gate electrode connected to said gate electrode of said third NMOS transistor and to said drain electrode of said fourth PMOS transistor, and a source electrode connected to said first source;

said input circuit is used when both said input signal inputted to said input terminal and said reference voltage inputted to said reference voltage input terminal are at levels closer to said first potential than to said second potential; and said level shift circuit includes, a fifth PMOS transistor having a gate electrode connected to said input terminal, a source electrode connected to said first differential input and receiving a predetermined current, and a drain electrode connected to said first source, a sixth PMOS transistor having a gate electrode connected to said reference voltage input terminal, a source electrode connected to said second differential input and receiving a predetermined current, and a drain electrode connected to said first source, a bias voltage generating circuit for outputting a predetermined potential, a seventh PMOS transistor having a gate electrode receiving said predetermined potential from said bias voltage generating circuit, a source electrode connected to said second source, and a drain electrode connected to said source electrode of said fifth PMOS transistor, for applying said predetermined current to said source electrode of said fifth PMOS transistor, and an eighth PMOS transistor having a gate electrode receiving said predetermined potential from said bias voltage generating circuit, a source electrode connected to said second source, and a drain electrode connected to said source electrode of said sixth PMOS transistor, for applying said predetermined current to said source electrode of said sixth PMOS transistor.

2. The input circuit of claim 1, further comprising:

a control signal input terminal receiving a control signal; and a fifth NMOS transistor having a drain electrode connected to said input of said CMOS inverter circuit, a source electrode connected to said first source, and a gate electrode connected to said control signal input terminal, wherein said bias voltage generating circuit includes a bias voltage generating circuit with control function connected to said control signal input terminal for outputting said first potential as said predetermined potential on receipt of said control signal from said control signal input terminal, wherein said first differential amplifier circuit includes a ninth PMOS transistor connected in series between said source electrodes of said first and second PMOS transistors and said second source and having a gate electrode connected to said control signal input terminal, and wherein said second differential amplifier circuit includes a tenth PMOS transistor connected in series between said source electrodes of said third and fourth PMOS transistors and said second source and having a gate electrode connected to said control signal input terminal.

3. An input circuit for a semiconductor integrated circuit device which receives a binary signal for outputting a first potential or a second potential higher than said first potential in response to said binary signal, said input circuit comprising:

an input terminal receiving said binary input signal;

a reference voltage input terminal receiving a reference voltage serving as a reference for distinction of logical states;

a level shift circuit connected to said input terminal and said reference voltage input terminal, for changing a center of amplitude of said input signal to a predetermined level without changing an amplitude of said input signal and for changing said reference voltage to said predetermined level, and to output signals;

at least one cascaded differential amplifier circuit having first and second differential inputs receiving the output signals of said level shift circuit, respectively, for amplifying a difference between said input signal and said reference voltage to output the amplified difference;

a CMOS inverter circuit having an input connected to the output of said differential amplifier circuit and an output for outputting said first or second potential in response to the output of said differential amplifier circuit; and an output terminal connected to said output of said CMOS inverter circuit;

wherein the amplitude of said input signal is such that differential amplification is impossible without first changing the center of amplitude to said predetermined level; wherein, said differential amplifier circuit includes a plurality of cascaded differential amplifier circuits;

said plurality of differential amplifier circuits include a CMOS differential amplifier circuit having an NMOS current mirror load;

said CMOS differential amplifier circuit having said NMOS current mirror load includes, (a) a first differential amplifier circuit including, a first PMOS transistor having a source electrode connected to a second source having said second potential, a gate electrode connected to said first differential input, and a drain electrode, a second PMOS transistor having a source electrode connected to said second source, a gate electrode connected to said second differential input, and a drain electrode;

a first NMOS transistor of said NMOS current mirror load having a drain electrode connected to said drain electrode of said first PMOS transistor, a source electrode connected to a first source having said first potential, and a gate electrode; and a second NMOS transistor of said NMOS current mirror load having a gate electrode connected to said gate electrode of said first NMOS transistor and to said drain electrode of said second PMOS transistor, a drain electrode connected to said drain electrode of said second PMOS transistor, and a source electrode connected to said first source, and (b) a second differential amplifier circuit including, a third PMOS transistor having a source electrode connected to said second source, a gate electrode connected to said drain electrode of said first NMOS transistor, and a drain electrode;

a fourth PMOS transistor having a source electrode connected to said second source, a gate electrode connected to said drain electrode of said second NMOS transistor, and a drain electrode;

a third NMOS transistor of said NMOS current mirror load having a drain electrode connected to said drain electrode of said third PMOS transistor, a source electrode connected to said first source, and a gate electrode; and a fourth NMOS transistor of said NMOS current mirror load having a gate electrode connected to said gate electrode of said third NMOS transistor and to said drain electrode of said fourth PMOS transistor, and a source electrode connected to said first source:

said input circuit is used when both said input signal inputted to said input terminal and said reference voltage inputted to said reference voltage input terminal are at levels closer to said second potential than to said first potential; and said level shift circuit includes, a fifth NMOS transistor having a gate electrode connected to said input terminal, a source electrode connected to said first differential induct and receiving a predetermined current, and a drain electrode connected to said second source, a sixth NMOS transistor having a gate electrode connected to said reference voltage input terminal, a source electrode connected to said second differential input and receiving a predetermined current, and a drain electrode connected to said second source, a bias voltage generating circuit for outputting a predetermined potential, a seventh NMOS transistor having a gate electrode receiving said predetermined potential from said bias voltage generating circuit, a source electrode connected to said first source, and a drain electrode connected to said source electrode of said fifth NMOS transistor, for applying said predetermined current to said source electrode of said fifth NMOS transistor, and an eighth NMOS transistor having a gate electrode receiving said predetermined potential from said bias voltage generating circuit, a source electrode connected to said first source, and a drain electrode connected to said source electrode of said sixth NMOS transistor, for applying said predetermined current to said source electrode of said sixth NMOS transistor.

4. The input circuit of claim 3, further comprising:

a control signal input terminal receiving a control signal; and a ninth NMOS transistor having a drain electrode connected to said input of said CMOS inverter circuit, a source electrode connected to said first source, and a gate electrode connected to said control signal input terminal, wherein said bias voltage generating circuit includes a bias voltage generating circuit with control function connected to said control signal input terminal for outputting said second potential as said predetermined potential on receipt of the logically inverted signal of said control signal from said control signal input terminal, wherein said first differential amplifier circuit includes a fifth PMOS transistor connected in series between said source electrodes of said first and second PMOS transistors and said second source and having a gate electrode connected to said control signal input terminal, and wherein said second differential amplifier circuit includes a sixth PMOS transistor connected in series between said source electrodes of said third and fourth PMOS transistors and said second source and having a gate electrode connected to said control signal input terminal.

5. An input circuit for a semiconductor integrated circuit device which receives a binary signal for outputting a first potential or a second potential higher than said first potential in response to said binary signal, said input circuit comprising:

an induct terminal receiving said binary input signal;

a reference voltage input terminal receiving a reference voltage serving as a reference for distinction of logical states;

a level shift circuit connected to said input terminal and said reference voltage input terminal, for changing a center of amplitude of said input signal to a predetermined level without changing an amplitude of said input signal and for changing said reference voltage to said predetermined level, and to output signals;

at least one cascaded differential amplifier circuit having first and second differential inputs receiving the output signals of said level shift circuit, respectively, for amplifying a difference between said input signal and said reference voltage to output the amplified difference;

a CMOS inverter circuit having an input connected to the output of said differential amplifier circuit and an output for outputting said first or second potential in response to the output of said differential amplifier circuit; and an output terminal connected to said output of said CMOS inverter circuit;

wherein, the amplitude of said input signal is such that differential amplification is impossible without first changing the center of amplitude to said predetermined level;

said differential amplifier circuit includes a plurality of cascaded differential amplifier circuits including a CMOS differential amplifier circuit having a PMOS current mirror load, said CMOS differential amplifier circuit having said PMOS current mirror load includes, (a) a first differential amplifier circuit including:

a first NMOS transistor having a source electrode connected to said a first source having first potential, a gate electrode connected to said first differential input, and a drain electrode;

a second NMOS transistor having source electrode connected to said first source, a gate electrode connected to said second differential induct, and a drain electrode;

a first PMOS transistor of said PMOS current mirror load having a drain electrode connected to said drain electrode of said first NMOS transistor, a source electrode connected to a second source having said second potential, and a gate electrode; and a second PMOS transistor of said PMOS current mirror load having a gate electrode connected to said gate electrode of said first PMOS transistor and to said drain electrode of said second NMOS transistor, a drain electrode connected to said drain electrode of said second NMOS transistor, and a source electrode to said second source and (b) a second differential amplifier circuit including:

a third NMOS transistor having a source electrode connected to said first source, a gate electrode connected to said drain electrode of said first PMOS transistor, and a drain electrode;

a fourth NMOS transistor having a source electrode connected to said first source, a gate electrode connected to said drain electrode of said second PMOS transistor, and a drain electrode;

a third PMOS transistor of said MOS current mirror load having a drain electrode connected to said drain electrode of said third NMOS transistor, a source electrode connected to said second source, and a gate electrode; and a fourth PMOS transistor of said PMOS current mirror load having a gate electrode connected to said gate electrode of said third PMOS transistor and to said drain electrode of said fourth NMOS transistor, a drain electrode connected to said drain electrode of said fourth NMOS transistor, and a source electrode connected to said secondary source;

said input circuit is used when both said input signal inputted to said induct terminal and said reference voltage inputted to said reference voltage input terminal are at levels closer to said first potential than to said second potential;

said level shift circuit includes, a fifth PMOS transistor having a gate electrode connected to said input terminal, a source electrode connected to said first differential input and receiving a predetermined current, and a drain electrode connected to said first source, a sixth PMOS transistor having a gate electrode connected to said reference voltage input terminal, a source electrode connected to said second differential input and receiving a predetermined current, and a drain electrode connected to said first source, a bias voltage generating circuit for outputting a predetermined potential, a seventh PMOS transistor having a gate electrode receiving said predetermined potential from said bias voltage generating circuit, a source electrode connected to said second source, and a drain electrode connected to said source electrode of said fifth PMOS transistor, for applying said predetermined current to said source electrode of said fifth PMOS transistor, and an eighth PMOS transistor having a gate electrode receiving said predetermined potential from said bias voltage generating circuit, a source electrode connected to said second source, and a drain electrode, for applying said predetermined current to said source electrode of said sixth PMOS transistor.

6. The input circuit of claim 5, further comprising:

a control signal input terminal receiving a control signal; and a fifth NMOS transistor having a drain electrode connected to said input of said CMOS inverter circuit, a source electrode connected to said first source, and a gate electrode connected to said control signal input terminal, wherein said bias voltage generating circuit includes a bias voltage generating circuit with control function connected to said control signal input terminal for outputting said first potential as said predetermined potential on receipt of said control signal from said control signal input terminal, wherein said first differential amplifier circuit includes a ninth PMOS transistor connected in series between said source electrodes of said first and second PMOS transistors and said second source and having a gate electrode connected to said control signal input terminal, and wherein said second differential amplifier circuit includes a tenth PMOS transistor connected in series between said source electrodes of said third and fourth PMOS transistors and said second source and having a gate electrode connected to said control signal input terminal.

7. An input circuit for a semiconductor integrated circuit device which receives a binary signal for outputting a first potential or a second potential higher than said first potential in response to said binary signal, said input circuit comprising:

an input terminal receiving said binary input signal;

a reference voltage input terminal receiving a reference voltage serving as a reference for distinction of logical states;

a level shift circuit connected to said input terminal and said reference voltage input terminal, for changing a center of amplitude of said input signal to a predetermined level without changing an amplitude of said input signal and for changing said reference voltage to said predetermined level, and to output signals;

at least one cascaded differential amplifier circuit having first and second differential inputs receiving the output signals of said level shift circuit, respectively, for amplifying a difference between said input signal and said reference voltage to output the amplified difference;

a CMOS inverter circuit having an input connected to the output of said differential amplifier circuit and an output for outputting said first or second potential in response to the output of said differential amplifier circuit; and an output terminal connected to said output of said CMOS inverter circuit;

wherein, the amplitude of said input signal is such that differential amplification is impossible without first changing the center of amplitude to said predetermined level;

said differential amplifier circuit includes a plurality of cascaded differential amplifier circuits, including a CMOS differential amplifier circuit having a PMOS current mirror load, said CMOS differential amplifier circuit having said PMOS current mirror load includes, (a) a first differential amplifier circuit including:

a first NMOS transistor having a source electrode connected to said a first source having first potential, a gate electrode connected to said first differential input, and a drain electrode, a second NMOS transistor having source electrode connected to said first source gate electrode connected to said second differential input, and a drain electrode, a first PMOS transistor of said PMOS current mirror load having a drain electrode connected to said drain electrode of said first NMOS transistor, a source electrode connected to a second source having said second potential, and a gate electrode, and a second PMOS transistor of said PMOS current mirror load having a gate electrode connected to said gate electrode of said first PMOS transistor and to said drain electrode of said second NMOS transistor, a drain electrode connected to said drain electrode of said second NMOS transistor, and a source electrode to said second source, and (b) a second differential amplifier circuit including, a third NMOS transistor having a source electrode connected to said first source, a gate electrode connected to said drain electrode of said first PMOS transistor, and a drain electrode, a fourth NMOS transistor having a source electrode connected to said first source, a gate electrode connected to said drain electrode of said second PMOS transistor, and a drain electrode, a third PMOS transistor of said PMOS current mirror load having a drain electrode connected to said drain electrode of said third NMOS transistor, a source electrode connected to said second source, and a gate electrode, and a fourth PMOS transistor of said PMOS current mirror load having a gate electrode connected to said gate electrode of said third PMOS transistor and to said drain electrode of said fourth NMOS transistor, a drain electrode connected to said drain electrode of said fourth NMOS transistor, and a source electrode connected to said secondary source;

said input circuit is used when both said induct signal inputted to said input terminal and said reference voltage inputted to said reference voltage input terminal are at levels closer to said second potential than to said first potential;

said level shift circuit including, a fifth NMOS transistor having a gate electrode connected to said input terminal, a source electrode connected to said first differential input and receiving a predetermined current, and a drain electrode connected to said second source;

a sixth NMOS transistor having a gate electrode connected to said reference voltage input terminal, a source electrode connected to said second differential input and receiving a predetermined current, and a drain electrode connected to said second source potential, a bias voltage generating circuit for outputting a predetermined potential, a seventh NMOS transistor having a gate electrode receiving said predetermined potential from said bias voltage generating circuit, a source electrode connected to said first source, and a drain electrode connected to said source electrode of said fifth NMOS transistor, for applying said predetermined current to said source electrode of said fifth NMOS transistor, and an eighth NMOS transistor having a gate electrode receiving said predetermined potential from said bias voltage generating circuit, a source electrode connected to said first source, and a drain electrode connected to said source electrode of said sixth NMOS transistor, for applying said predetermined current to said source electrode of said sixth NMOS transistor.

8. The input circuit of claim 7, further comprising:

a control signal input terminal receiving a control signal; and a ninth NMOS transistor having a drain electrode connected to said input of said CMOS inverter circuit, a source electrode connected to said first source, and a gate electrode connected to said control signal input terminal, wherein said bias voltage generating circuit includes a bias voltage generating circuit with control function connected to said control signal input terminal for outputting said second potential as said predetermined potential on receipt of the logically inverted signal of said control signal from said control signal input terminal, wherein said first differential amplifier circuit includes a fifth PMOS transistor connected in series between said source electrodes of said first and second PMOS transistors and said second source and having a gate electrode connected to said control signal input terminal, and wherein said second differential amplifier circuit includes a sixth PMOS transistor connected in series between said source electrodes of said third and fourth PMOS transistors and said second source and having a gate electrode connected to said control signal input terminal.

9. An input circuit for a semiconductor integrated circuit device which receives a binary signal, for outputting a first potential or a second potential higher than said first potential in response to said binary signal, said induct circuit comprising:

an input terminal receiving said binary signal;

a reference voltage input terminal receiving a reference voltage serving as a reference for distinction of logical states;

a first differential amplifier circuit which includes,
first and second differential inputs connected to said input terminal and said reference voltage input terminal respectively, and
a differential pair formed by PMOS transistors for amplifying a difference between said binary signal and said reference voltage to output the amplified differences;

at least one second, cascaded differential amplifier circuit which is connected to said first differential amplifier circuit and which includes,
differential pair formed by NMOS transistors for further amplifying the amplified difference to output the further amplified difference;

a CMOS inverter circuit having an input connected to the output of said second differential amplifier circuit and an output for outputting said first or second potential in response to said output of said second differential amplifier circuit;

an output terminal connected to said output of said CMOS inverter circuit; and a control signal input terminal receiving a control signal; wherein said different amplifier circuit includes, a CMOS differential amplifier circuit having an NMOS current mirror load including, a first transistor of said PMOS differential pair having a source electrode connected to a second source having said second potential, a gate electrode connected to said first differential input, and a drain electrode, a second PMOS transistor of said PMOS differential pair having a source electrode connected to said second source, a gate electrode connected to said second differential input, and a drain electrode, a first NMOS transistor of said NMOS current mirror load having a drain electrode connected to said drain electrode of said first PMOS transistor, a source electrode connected to a first source having said first potential, and a gate electrode, and a second NMOS transistor of said NMOS current mirror load having a gate electrode connected to said gate electrode of said first NMOS transistor and to said drain electrode of said second PMOS transistor, a drain electrode connected to said drain electrode of said second PMOS transistor, and a source electrode connected to said first source;

said second differential amplifier circuit includes, a CMOS differential amplifier circuit having a PMOS current mirror load including, a third NMOS transistor of said NMOS differential pair having a source electrode connected to said first source, a gate electrode connected to said drain electrode of said first NMOS transistor, and a drain electrode, a fourth NMOS transistor of said NMOS differential pair having a source electrode connected to said first source, a gate electrode connected to said drain electrode of said NMOS transistor, and a drain electrode, a third PMOS transistor of said PMOS current mirror load having a drain electrode connected to said drain electrode of said third NMOS transistor, a source electrode connected to said second source, and a gate electrodes, and a fourth PMOS transistor of said PMOS current mirror load having a gate electrode connected to said gate electrode of said third PMOS transistor, a drain electrode connected to said drain electrode of said fourth NMOS transistor, and a source electrode connected to said second source;

a fifth NMOS transistor having a drain electrode connected to said input of said CMOS inverter circuit, a source electrode connected to said first source, and a gate electrode connected to said control signal input terminal;

fifth and sixth PMOS transistors connected in series between said source electrodes of said first and second PMOS transistors respectively and said second source and each having a gate electrode connected to said control signal input terminal; and seventh and eighth PMOS transistors connected in series between said source electrodes of said third and fourth PMOS transistors respectively and said second source and each having a gate electrode connected to said control signal input terminal.

10. An input circuit for a semiconductor integrated circuit device which receives a binary signal for outputting a first potential or a second potential higher than said first potential in response to said binary signal, said input circuit comprising:

an input terminal receiving said binary signal;

a reference voltage input terminal receiving a reference voltage serving as a reference for distinction of logical states;

a first differential amplifier circuit which includes, first and second differential inputs connected to said input terminal and said reference voltage input terminal respectively, and a differential pair formed by PMOS transistors for amplifying a difference between said binary signal and said reference voltage output the amplified differences;

at least one second, cascaded differential amplifier circuit which is connected to said first differential amplifier circuit and which includes, a differential pair formed by NMOS transistors for further amplifying the amplified difference to output the further amplified difference;

a CMOS inverter circuit having an input connected to the output of said second differential amplifier circuit and an output for outputting said first or second potential in response to said output of said second differential amplifier circuit;

an output terminal connected to said output of said CMOS inverter circuits, and a control signal input terminal receiving a control signal; wherein said first differential amplifier circuit includes a CMOS differential amplifier circuit having an NMOS current mirror load including, a first PMOS transistor of said PMOS differential pair having a source electrode connected to a second source having said second potential, a gate electrode connected to said first differential input, and a drain electrode, a second PMOS transistor of said PMOS differential pair having a source electrode connected to said second source, a gate electrode connected to said second differential input, and a drain electrode, a first NMOS transistor of said NMOS current mirror load having a drain electrode connected to said drain electrode of said first PMOS transistor, a source electrode connected to a first source having said first potential, and a gate electrode, and a second NMOS transistor of said NMOS current mirror load having a gate electrode connected to said gate electrode of said first NMOS transistor and to said drain electrode of said second PMOS transistor, a drain electrode connected to said drain electrode of said second PMOS transistor, and a source electrode connected to said first source;

said second differential amplifier circuit includes a CMOS differential amplifier circuit having a PMOS current mirror load including, a third NMOS transistor of said NMOS differential pair having a source electrode connected to said first source, a gate electrode connected to said first differential amplifier circuit, and a drain electrode, a fourth NMOS transistor of said NMOS differential pair having a source electrode connected to said first source, a gate electrode connected to said first differential amplifier circuit, and a drain electrode, a third PMOS transistor of said PMOS current mirror load having a drain electrode connected to said drain electrode of said third NMOS transistor, a source electrode connected to said second source, and a gate electrode, and a fourth PMOS transistor of said PMOS current mirror load having a gate electrode connected to said gate electrode of said third NMOS transistor and to said drain electrode of said fourth NMOS transistor, a drain electrode connected to said drain electrode of said fourth NMOS transistor, and a source electrode connected to said second source;

a fifth NMOS transistor having a drain electrode connected to said input of said CMOS inverter circuit, a source electrode connected to said first source, and a gate electrode connected to said control signal input terminal;

fifth and sixth PMOS transistors connected in series between said source electrodes of said first and second PMOS transistors and said second source respectively and each having a gate electrode connected to said control signal input terminal; and seventh and eighth PMOS transistor connected in series between said source electrodes of said third and fourth PMOS transistors and said second source respectively and each having a gate electrode connected to said control signal input terminal.

11. An input circuit for a semiconductor integrated circuit device which receives a binary signal for outputting a first potential or a second potential higher than said first potential in response to said binary signal, said input circuit comprising:

an input terminal receiving said binary input signal;

a reference voltage input terminal receiving a reference voltage serving as a reference for distinction of logical states;

a voltage changer circuit connected to said input terminal and said reference voltage input terminal for performing voltage change so that said input signal and said reference voltage are shifted a predetermined amount of voltage, respectively, to output signals;

at least one cascaded differential amplifier circuit having first and second differential inputs receiving the output signals of said voltage changer circuit, respectively, for amplifying a difference between said input signal and said reference voltage to output the amplified difference;

a CMOS inverter circuit having an input connected to the output of said differential amplifier circuit and an output for outputting said first or second potential in response to the output of said differential amplifier circuit; and an output terminal connected to said output of said CMOS inverter circuit;

said input circuit being adjusted such that said CMOS inverter circuit outputs said first or second potential when said input signal is higher than said reference voltage and said CMOS inverter circuit outputs said second or first potential when said input signal is lower than said reference voltage, wherein said differential amplifier circuit includes a differential amplifier circuit characterized so that its common-mode gain divided by its differential-mode gain is less than the ratio of the amplitude of said input signal to variation of said reference voltage.

12. The input circuit of claim 11, wherein said differential amplifier circuit includes PMOS and NMOS transistors of the same mutual conductance.

13. An input circuit for a semiconductor integrated circuit device which receives a binary signal for outputting a first potential or a second potential higher than said first potential in response to said binary signal, said input circuit comprising:

an input terminal receiving said binary input signal;

a reference voltage input terminal receiving a reference voltage serving as a reference for distinction of logical states;

a first differential amplifier circuit having first and second differential inputs connected to said input terminal and said reference voltage input terminal, respectively, for amplifying a difference between said input signal and said reference voltage to output the amplified difference;

at least one second, cascaded differential amplifier circuit connected to said first differential amplifier circuit for further amplifying the amplified difference to output the further amplified difference;

a CMOS inverter circuit having an input connected to the output of said second differential amplifier circuit and an output for outputting said first or second potential in response to said output of said second differential amplifier circuit;

an output terminal connected to said output of said CMOS inverter circuit;

wherein said first and second differential amplifier circuits each have a common-mode gain and differential-mode gain and a product of said common-mode gains divided by product of said differential-mode gains is less than a ratio of the amplitude of said input signal to a variation of said reference voltage; and wherein said first differential amplifier circuit includes a CMOS differential amplifier circuit having an NMOS current mirror load including:

a first PMOS transistor having a source electrode connected to a second source having said second potential, a gate electrode connected to said first differential input, and a drain electrode;

a second PMOS transistor having a source electrode connected to said second source, a gate electrode connected to said second differential input, and a drain electrode;

a first NMOS transistor of said NMOS current mirror load having a drain electrode connected to said drain electrode of said first PMOS transistor, a source electrode connected to a first source having said first potential, and a gate electrode; and a second NMOS transistor of said NMOS current mirror load having a gate electrode connected to said gate electrode of said first NMOS transistor and to said drain electrode of said second PMOS transistor, a drain electrode connected to said drain electrode of said second PMOS transistor, and a source electrode connected to said first source; and wherein said second differential amplifier circuit includes a CMOS differential amplifier circuit having a NMOS current mirror load including:

a third PMOS transistor having a source electrode connected to said second source, a gate electrode connected to said drain electrode of said first NMOS transistor, and a drain electrode;

a fourth PMOS transistor having a source electrode connected to said second source, a gate electrode connected to said drain electrode of said second NMOS transistor, and a drain electrode;

a third NMOS transistor of said NMOS current mirror load having a drain electrode connected to said drain electrode of said third PMOS transistor, a source electrode connected to said first source, and a gate electrode; and a fourth NMOS transistor of said NMOS current mirror load having a gate electrode connected to said gate electrode of said third NMOS transistor and to said drain electrode of said fourth PMOS transistor, a drain electrode connected to said drain electrode of said fourth PMOS transistor, and a source electrode connected to said first source.

14. The input circuit of claim 13, further comprising:

a control signal input terminal receiving a control signal; and a fifth NMOS transistor having a drain electrode connected to said input of said CMOS inverter circuit, a source electrode connected to said first source, and a gate electrode connected to said control signal input terminal, wherein said first differential amplifier circuit includes fifth and sixth PMOS transistors connected in series between said source electrodes of said first and second PMOS transistors respectively and said second source and each having a gate electrode connected to said control signal input terminal, and wherein said second differential amplifier circuit includes seventh and eighth PMOS transistors connected in series between said source electrodes of said third and fourth PMOS transistors respectively and said second source and each having a gate electrode connected to said control signal input terminal.

15. An input circuit for a semiconductor integrated circuit device which receives a binary signal for outputting a first potential or a second potential higher than said first potential in response to said binary signal, said input circuit comprising:

an input terminal receiving said binary input signal;

a reference voltage input terminal receiving a reference voltage serving as a reference for distinction of logical states;

a first differential amplifier circuit having first and second differential inputs connected to said input terminal and said reference voltage input terminal, respectively, for amplifying a difference between said input signal and said reference voltage to output the amplified difference;

at least one second, cascaded differential amplifier circuit connected to said first differential amplifier circuit for further amplifying the amplified difference to output the further amplified difference;

a CMOS inverter circuit having an input connected to the output of said second differential amplifier circuit and an output for outputting said first or second potential in response to said output of said second differential amplifier circuit; and an output terminal connected to said output of said CMOS inverter circuit;

said input circuit being adjusted such that said CMOS inverter circuit outputs said first or second potential when said input signal is higher than said reference voltage and said CMOS inverter circuit outputs said second or first potential when said input signal is lower than said reference voltage, wherein each of said first and second differential amplifier circuits includes a differential amplifier circuit characterized so that the product of their common-mode gains divided by the product of their differential-mode gains is less than the ratio of the amplitude of said input signal to variation of said reference voltage.

16. The input circuit of claim 15, wherein said first differential amplifier circuit includes PMOS and NMOS transistors of the same mutual conductance.

17. The input circuit of claim 16, wherein said second differential amplifier circuit includes PMOS and NMOS transistors of the same mutual conductance.

18. An input circuit for a semiconductor integrated circuit device which receives a binary signal for outputting a first potential or a second potential higher than said first potential in response to said binary signal, said input circuit comprising:

an input terminal receiving said binary input signal;

a reference voltage input terminal receiving a reference voltage serving as a reference for distinction of logical states;

a first differential amplifier circuit having first and second differential inputs connected to said input terminal and said reference voltage input terminal, respectively, for amplifying a difference between said input signal and said reference voltage to output the amplified difference;

at least one second, cascaded differential amplifier circuit connected to said first differential amplifier circuit for further amplifying the amplified difference to output the further amplified difference;

a CMOS inverter circuit having an input connected to the output of said second differential amplifier circuit and an output for outputting said first or second potential in response to said output of said second differential amplifier circuit; and an output terminal connected to said output of said CMOS inverter circuit;

wherein said first differential amplifier circuit includes:

a first NMOS transistor having a source electrode connected to a first source having said first potential, a gate electrode connected to said first differential input, and a drain electrode, a second NMOS transistor having a source electrode connected to said first source, a gate electrode connected to said second differential input, and a drain electrode, a first PMOS transistor having a drain electrode connected to said drain electrode of said first NMOS transistor, a source electrode connected to a second source having said second potential, and a gate electrode, and a second PMOS transistor having a gate electrode connected to said gate electrode of said first PMOS transistor and to said drain electrode of said second NMOS transistor, a drain electrode connected to said drain electrode of said second NMOS transistor, and a source electrode connected to said second source; and wherein said second differential amplifier circuit includes a CMOS differential amplifier circuit having a PMOS current mirror load including:

a third NMOS transistor having a source electrode connected to said first source, a gate electrode connected to said drain electrode of said first NMOS transistor, and a drain electrode, a fourth NMOS transistor having a source electrode connected to said first source, a gate electrode connected to said drain electrode of said second NMOS transistor, and a drain electrode, a third PMOS transistor having a drain electrode connected to said drain electrode of said third NMOS transistor, a source electrode connected to said second source, and a gate electrode, and a fourth PMOS transistor having a gate electrode connected to said gate electrode of said third PMOS transistor and to said drain electrode of said fourth NMOS transistor, a drain electrode connected to said drain electrode of said fourth NMOS transistor, and a source electrode connected to said second source;

said input circuit further comprising:

a control signal input terminal receiving a control signal; and a fifth NMOS transistor having a drain electrode connected to said input of said CMOS inverter circuit, a source electrode connected to said first source, and a gate electrode connected to said control signal input terminal;

wherein said first differential amplifier circuit includes:

fifth and sixth PMOS transistors connected in series between said source electrodes of said first and second PMOS transistors respectively and said second source and each having a gate electrode connected to said control signal input terminal; and wherein said second differential amplifier circuit includes:

seventh and eighth PMOS transistors connected in series between said source electrodes of said third and fourth PMOS transistors respectively and said second source and each having a gate electrode connected to said control signal input terminal.

19. An input circuit for a semiconductor integrated circuit device which receives a binary signal for outputting a first potential or a second potential higher than said first potential in response to said binary signal, said input circuit comprising:

an input terminal receiving said binary input signal;

a reference voltage input terminal receiving a reference voltage serving as a reference for distinction of logical states;

a first differential amplifier circuit having first and second differential inputs connected to said input terminal and said reference voltage input terminal, respectively, for amplifying a difference between said input signal and said reference voltage to output the amplified difference;

at least one second, cascaded differential amplifier circuit connected to said first differential amplifier circuit for further amplifying the amplified difference to output the further amplified difference;

a CMOS inverter circuit having an input connected to the output of said second differential amplifier circuit and an output for outputting said first or second potential in response to said output of said second differential amplifier circuit; and an output terminal connected to said output of said CMOS inverter circuit;

wherein said first differential amplifier circuit includes:

a first NMOS transistor having a source electrode connected to a first source having said first potential, a gate electrode connected to said first differential input, and a drain electrode, a second NMOS transistor having a source electrode connected to said first source, a gate electrode connected to said second differential input, and a drain electrode, a first PMOS transistor having a drain electrode connected to said drain electrode of said first NMOS transistor, a source electrode connected to a second source having said second potential, and a gate electrode, and a second PMOS transistor having a gate electrode connected to said gate electrode of said first PMOS transistor and to said drain electrode of said second NMOS transistor, a drain electrode connected to said drain electrode of said second NMOS transistor, and a source electrode connected to said second source;

wherein said second differential amplifier circuit includes a CMOS differential amplifier circuit having a NMOS current mirror load including:

a third PMOS transistor having a source electrode connected to said second potential, a gate electrode connected to said drain electrode of said first PMOS transistor, and a drain electrode, a fourth PMOS transistor having a source electrode connected to said second potential, a gate electrode connected to said drain electrode of said second PMOS transistor, and a drain electrode, a third NMOS transistor having a drain electrode connected to said drain electrode of said third PMOS transistor, a source electrode connected to said first potential, and a gate electrode, and a fourth NMOS transistor having a gate electrode connected to said gate electrode of said third NMOS transistor and to said drain electrode of said fourth PMOS transistor, a drain electrode connected to said drain electrode of said fourth PMOS transistor, and a source electrode connected to said first potential;

said input circuit further comprising:

a control signal input terminal receiving a control signal; and a fifth NMOS transistor having a drain electrode connected to said input of said CMOS inverter circuit, a source electrode connected to said first source, and a gate electrode connected to said control signal input terminal;

wherein said first differential amplifier circuit includes fifth and sixth PMOS transistors connected in series between source electrodes of said first and second PMOS transistors respectively and said second source and each having a gate electrode connected to said control signal input terminal; and wherein said second differential amplifier circuit includes seventh and eighth PMOS transistors connected in series between said source electrodes of said third and fourth PMOS transistors respectively and said second source and each having a gate electrode connected to said control signal input terminal.

20. An input circuit for a semiconductor integrated circuit device which receives a binary signal for outputting a first potential or a second potential higher than said first potential in response to said binary signal, said input circuit comprising:

an input terminal receiving said binary input signal;

a reference voltage input terminal receiving a reference voltage serving as a reference for distinction of logical states;

a first differential amplifier circuit having first and second differential inputs connected to said input terminal and said reference voltage input terminal, respectively, for amplifying a difference between said input signal and said reference voltage to output the amplified difference;

at least one second, cascaded differential amplifier circuit connected to said first differential amplifier circuit for further amplifying the amplified difference to output the further amplified difference;

a CMOS inverter circuit having an input connected to the output of said second differential amplifier circuit and an output for outputting said first or second potential in response to said output of said second differential amplifier circuit; and an output terminal connected to said output of said CMOS inverter circuit;

wherein said first differential amplifier circuit includes:

a first NMOS transistor having a source electrode connected to a first source having said first potential, a gate electrode connected to said first differential input, and a drain electrode, a second NMOS transistor having a source electrode connected to said first source, a gate electrode connected to said second differential input, and a drain electrode, a first PMOS transistor having a drain electrode connected to said drain electrode of said first NMOS transistor, a source electrode connected to a second source having said second potential, and a gate electrode, and a second PMOS transistor having a gate electrode connected to said gate electrode of said first PMOS transistor and to said drain electrode of said second NMOS transistor, a drain electrode connected to said drain electrode of said second NMOS transistor, and a source electrode connected to said second source; and wherein said second differential amplifier circuit includes:

a CMOS differential amplifier circuit having a PMOS current mirror load including:

a third NMOS transistor having a source electrode connected to said first source, a gate electrode connected to said drain electrode of said first NMOS transistor, and a drain electrode, a fourth NMOS transistor having a source electrode connected to said first source, a gate electrode connected to said drain electrode of said second NMOS transistor, and a drain electrode, a third PMOS transistor having a drain electrode connected to said drain electrode of said third NMOS transistor, a source electrode connected to said second source, and a gate electrode, and a fourth PMOS transistor having a gate electrode connected to said gate electrode of said third PMOS transistor and to said drain electrode of said fourth NMOS transistor, a drain electrode connected to said drain electrode of said fourth NMOS transistor, and a source electrode connected to said second source;

said input circuit further comprising:

a control signal input terminal receiving a control signal; and a fifth NMOS transistor having a drain connected to said input of said CMOS inverter circuit, a source connected to said first source, and a gate connected to said control signal input terminal;

wherein said first differential amplifier circuit includes:

sixth and seventh NMOS transistors connected in series between said sources of said first and second NMOS transistors and said first source respectively and each having a gate electrode connected to said control signal input terminal; and wherein said second differential amplifier circuit includes:

eighth and ninth NMOS transistors connected in series between said sources of said third and fourth NMOS transistors and said first source respectively and each having a gate connected to said control signal input terminal.

21. An input circuit for a semiconductor integrated circuit device which receives a binary signal for outputting a first potential or a second potential higher than said first potential in response to said binary signal, said input circuit comprising:

an input terminal receiving said binary input signal;

a reference voltage input terminal receiving a reference voltage serving as a reference for distinction of logical states;

a first differential amplifier circuit having first and second differential inputs connected to said input terminal and said reference voltage input terminal, respectively, for amplifying a difference between said input signal and said reference voltage to output the amplified difference;

at least one second, cascaded differential amplifier circuit connected to said first differential amplifier circuit for further amplifying the amplified difference to output the further amplified difference;

a CMOS inverter circuit having an input connected to the output of said second differential amplifier circuit and an output for outputting said first or second potential in response to said output of said second differential amplifier circuit; and an output terminal connected to said output of said CMOS inverter circuit;

wherein said first differential amplifier circuit includes:

a first NMOS transistor having a source electrode connected to a first source having said first potential, a gate electrode connected to said first differential input, and a drain electrode, a second NMOS transistor having a source electrode connected to said first source, a gate electrode connected to said second differential input, and a drain electrode, a first PMOS transistor having a drain electrode connected to said drain electrode of said first NMOS transistor, a source electrode connected to a second source having said second potential, and a gate electrode, and a second PMOS transistor having a gate electrode connected to said gate electrode of said first PMOS transistor and to said drain electrode of said second NMOS transistor, a drain electrode connected to said drain electrode of said second NMOS transistor, and a source electrode connected to said second source; and wherein said second differential amplifier circuit includes a CMOS differential amplifier circuit having a NMOS current mirror load including:

a third PMOS transistor having a source electrode connected to said second potential, a gate electrode connected to said drain electrode of said first PMOS transistor, and a drain electrode, a fourth PMOS transistor having a source electrode connected to said second potential, a gate electrode connected to said drain electrode of said second PMOS transistor, and a drain electrode, a third NMOS transistor having a drain electrode connected to said drain electrode of said third PMOS transistor, a source electrode connected to said first potential, and a gate electrode, and a fourth NMOS transistor having a gate electrode connected to said gate electrode of said third NMOS transistor and to said drain electrode of said fourth PMOS transistor, a drain electrode connected to said drain electrode of said fourth PMOS transistor, and a source electrode connected to said first potential;

said input circuit further comprising:

a control signal input terminal receiving a control signal;

an inverter having an output terminal and having an input terminal connected to said control signal input terminal; and a fifth NMOS transistor having a drain connected to said input of said CMOS inverter circuit, a source connected to said first source, and a gate connected to said control signal input terminal;

wherein said first differential amplifier circuit includes:

sixth and seventh NMOS transistors connected in series between said sources of said first and second NMOS transistors and said first source respectively and each having a gate connected to said output terminal of said inverter; and wherein said second differential amplifier includes:

fifth and sixth PMOS transistors connected in series between said sources of said third and fourth PMOS transistors and said second source respectively and each having a gate connected to said control signal input terminal.

* * * * *